(12) United States Patent
Sheng

(10) Patent No.: US 11,784,216 B2
(45) Date of Patent: Oct. 10, 2023

(54) MANUFACTURING METHOD OF CAPACITIVE STRUCTURE, AND CAPACITOR

(71) Applicant: CHANGXIN MEMORY TECHNOLOGIES, INC., Hefei (CN)

(72) Inventor: Chaojun Sheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 216 days.

(21) Appl. No.: 17/468,812

(22) Filed: Sep. 8, 2021

(65) Prior Publication Data

US 2022/0077281 A1    Mar. 10, 2022

Related U.S. Application Data

(63) Continuation of application No. PCT/CN2021/103546, filed on Jun. 30, 2021.

(30) Foreign Application Priority Data

Sep. 10, 2020  (CN) .......................... 202010949024.7

(51) Int. Cl.
*H01L 23/522* (2006.01)
*H01L 49/02* (2006.01)
*H10B 12/00* (2023.01)

(52) U.S. Cl.
CPC ............. *H01L 28/92* (2013.01); *H01L 28/75* (2013.01); *H01L 28/91* (2013.01); *H10B 12/033* (2023.02); *H10B 12/315* (2023.02)

(58) Field of Classification Search
CPC ......... H01L 28/91; H01L 28/92; H01L 28/75; H01L 28/60; H01L 28/40; H01L 28/87;
(Continued)

(56) References Cited

U.S. PATENT DOCUMENTS 6,656,844 B1   12/2003   Lin
8,169,015 B2    5/2012   Hirota
(Continued)

FOREIGN PATENT DOCUMENTS

CN         101484976 B    2/2011
CN         105226046 A    1/2016
(Continued)

*Primary Examiner* — Omar F Mojaddedi
(74) *Attorney, Agent, or Firm* — Cooper Legal Group, LLC

(57) ABSTRACT

A manufacturing method of a capacitive structure includes: providing a semiconductor base; forming a first mask layer on the semiconductor base, the first mask layer having a plurality of first round hole patterns distributed uniformly; forming first openings distributed uniformly on the semiconductor base by etching based on the first round hole patterns; forming a second mask layer on one side, away from the semiconductor base, of the first openings, and forming a plurality of second patterns on the second mask layer; forming second openings distributed uniformly on the semiconductor base by etching based on the second patterns; and etching the first openings and the second openings to form capacitive holes, and depositing a lower electrode layer, a dielectric layer and an upper electrode layer within the capacitive holes to form the capacitive structure.

20 Claims, 20 Drawing Sheets

(58) Field of Classification Search
CPC ... H01L 28/88; H01L 23/5223; H10B 12/033; H10B 12/315
See application file for complete search history.

(56) References Cited

U.S. PATENT DOCUMENTS

| | | | |
|---|---|---|---|
| 8,384,143 B2 | 2/2013 | Hirota | |
| 8,884,350 B2 | 11/2014 | Hirota | |
| 9,087,729 B2 | 7/2015 | Park et al. | |
| RE46,798 E | 4/2018 | Hirota | |
| 10,103,165 B2 | 10/2018 | Son et al. | |
| 10,276,668 B2 | 4/2019 | Kim | |
| 10,283,509 B2 | 5/2019 | Pak et al. | |
| 10,304,838 B2 | 5/2019 | Kim et al. | |
| 10,559,568 B1 | 2/2020 | Huang | |
| 10,741,562 B2 | 8/2020 | Kim et al. | |
| 10,756,091 B2 | 8/2020 | Pak et al. | |
| 10,985,163 B2 | 4/2021 | Huang | |
| 2008/0217672 A1* | 9/2008 | Popp | H01L 28/91 257/305 |
| 2009/0146254 A1 | 6/2009 | Hirota | |
| 2010/0230787 A1* | 9/2010 | Guiraud | H01L 28/87 257/532 |
| 2012/0187537 A1 | 7/2012 | Hirota | |
| 2013/0134556 A1 | 5/2013 | Hirota | |
| 2015/0041973 A1 | 2/2015 | Park et al. | |
| 2017/0104057 A1* | 4/2017 | Voiron | H01L 28/87 |
| 2018/0019257 A1 | 1/2018 | Son | |
| 2018/0166449 A1 | 6/2018 | Pak et al. | |
| 2018/0166542 A1 | 6/2018 | Kim | |
| 2018/0211962 A1 | 7/2018 | Kim et al. | |
| 2019/0164976 A1* | 5/2019 | Kim | H10B 12/315 |
| 2019/0189619 A1 | 6/2019 | Pak et al. | |
| 2019/0252388 A1 | 8/2019 | Kim et al. | |
| 2020/0126994 A1 | 4/2020 | Huang | |
| 2020/0365595 A1* | 11/2020 | Sukekawa | H10B 12/31 |
| 2021/0036099 A1* | 2/2021 | Bouvier | H01L 28/87 |

FOREIGN PATENT DOCUMENTS

| | | |
|---|---|---|
| CN | 107301976 A | 10/2017 |
| CN | 107393909 A | 11/2017 |
| CN | 107564892 A | 1/2018 |
| CN | 107968044 A | 4/2018 |
| CN | 108010913 A | 5/2018 |
| CN | 108183097 A | 6/2018 |
| CN | 108346661 A | 7/2018 |
| CN | 108538835 A | 9/2018 |
| CN | 108717936 A | 10/2018 |
| CN | 109075164 A | 12/2018 |
| CN | 110957304 A | 4/2020 |
| CN | 111952449 A | 11/2020 |
| JP | 2008283026 A | 11/2008 |

\* cited by examiner

MANUFACTURING METHOD OF CAPACITIVE STRUCTURE, AND CAPACITOR

CROSS-REFERENCE TO RELATED APPLICATION

This is a continuation application of International Patent Application No. PCT/CN2021/103546, filed on Jun. 30, 2021, which claims priority to Chinese patent application No. 202010949024.7, filed on Sep. 10, 2020 and entitled "Manufacturing Method of Capacitive Structure, and Capacitor". The disclosures of International Patent Application No. PCT/CN2021/103546 and Chinese patent application No. 202010949024.7 are hereby incorporated by reference in their entireties.

TECHNICAL FIELD

The disclosure relates to the technical field of semiconductor device manufacturing, and in particular relates to a manufacturing method of a capacitive structure, and a capacitor.

BACKGROUND

In a process of forming a capacitive hole in a Dynamic Random Access Memory (DRAM), a capacitive hole structure is usually formed by a silicon nitride layer and two silicon dioxide layers under the action of a hard mask. At present, most of double-sided capacitors commonly formed adopt a single cylindrical supporting structure. For example, a supporting layer is directly formed on a bottom conducting wire of a base to serve as a bottom dielectric layer of a capacitor. Then, two sacrificial layers are formed in sequence, a hole structure is formed through an etching process. The hole structure extends to a conducting wire structure in the base, and afterwards, a lower electrode layer, a dielectric layer and an upper electrode layer are formed on the hole structure, thereby forming the single cylindrical supporting structure.

As the size of a DRAM device is getting smaller and smaller, the size of the capacitor needs to be continuously reduced, but the height of the capacitor needs to be continuously increased, so as to increase a capacitance value. However, this will inevitably cause the single cylindrical supporting structure to be unstable and easily broken and displaced to fall off, and thus the stability of the capacitor is influenced.

SUMMARY

A main purpose of the disclosure is to provide a manufacturing method of a capacitive structure, which can effectively prevent a supporting structure from falling off while increasing the height of the capacitive structure.

Another purpose of the disclosure is to provide a capacitor, which is provided with a stable supporting structure, and can satisfy the demand of continuous miniaturization of a semiconductor device.

In order to achieve the above purposes, according to an aspect of the disclosure, there is provided a manufacturing method of a capacitive structure. The method includes the following operations. A semiconductor base is provided. A first mask layer is formed on the semiconductor base, and a plurality of first round hole patterns distributed uniformly are formed on the first mask layer. Based on the first round hole patterns, first openings distributed uniformly are formed on the semiconductor base by etching, and each of the first openings has a first round projection on the semiconductor base. A second mask layer is formed on one side, away from the semiconductor base, of the first openings, and a plurality of second patterns are formed on the second mask layer. Based on the second patterns, second openings distributed uniformly are formed on the semiconductor base by etching, and meanwhile, the first openings are continuously etched, so that the first openings and the second openings are same in depth, and each of the second openings has a second projection on the semiconductor base, herein, a contour line of the second projection respectively intersects with contour lines of four adjacent first round projections. The first openings and the second openings are etched to form capacitive holes; and a lower electrode layer, a dielectric layer and an upper electrode layer are deposited within the capacitive holes, so that the capacitive structure is formed.

According to another aspect of the disclosure, there is provided a capacitor. The capacitor includes a semiconductor base, capacitive holes, a lower electrode layer, a dielectric layer and an upper electrode layer. The capacitive holes are arranged in the semiconductor base, and arranged in an array form. Herein, each of the capacitive holes is formed by four round first openings and one second opening, a projection of each of the first openings on the semiconductor base is a first round projection, a projection of the second opening on the semiconductor base is a second projection, a contour line of the second projection respectively intersects with contours lines of four adjacent first round projections, a continuous outer contour of the first round projection and the second projection forms a projection contour of a capacitive hole on the semiconductor base. The lower electrode layer, the dielectric layer and the upper electrode layer are deposited in the capacitive holes in sequence.

BRIEF DESCRIPTION OF THE DRAWINGS

The above and other features and advantages of the disclosure will become more apparent by describing exemplary implementation modes of the disclosure in detail with reference to the drawings.

Figure 1:
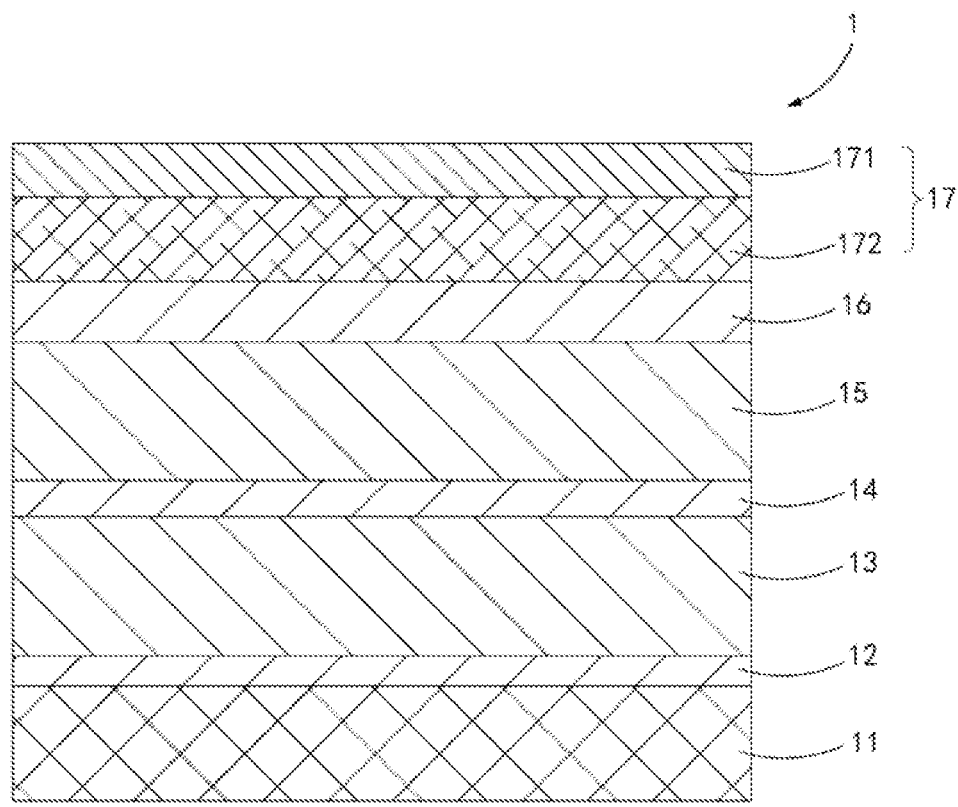
FIG. 1 is a schematic structural diagram of a semiconductor base provided in a manufacturing method of a capacitive structure in an exemplary embodiment of the disclosure.

DESCRIPTION OF THE REFERENCE SIGNS IN THE DRAWINGS 1, semiconductor base; 11, substrate; 12, first supporting layer; 13, first sacrificial layer; 14, second supporting layer; 15, second sacrificial layer; 16, third supporting layer; 17, basic mask layer; 171, first basic mask layer; 172, second basic mask layer; 2, first mask layer; 21, first hard mask layer; 22, first organic material layer; 23, second hard mask layer; 24, second organic material layer; 25, first opening; 3, second mask layer; 31, third organic material layer; 32, third hard mask layer; 33, first photoresist layer; 34, second opening; 4, capacitive hole; 5, third mask layer; 51, fourth organic material layer; 52, fourth hard mask layer; 53, second photoresist layer; 6, lower electrode layer; 7, dielectric layer; 8, upper electrode layer; 9, upper electrode.

DETAILED DESCRIPTION

Exemplary implementation modes are described more comprehensively with reference to the drawings at present. However, the exemplary implementation modes may be implemented in many forms, and should not be understood as limitation to implementation modes described here. On the contrary, these provided implementation modes enable the disclosure to be more comprehensive and complete, and conceptions of the exemplary implementation modes are comprehensively conveyed to those skilled in the art. The same signs in the drawings show same or similar structures, so that detailed description of them are omitted.

The following descriptions of different exemplary implementation modes of the disclosure are carried out with reference to the drawings. The drawings are one part of the disclosure. Moreover, different exemplary structures capable of realizing a plurality of aspects of the disclosure are displayed in an exemplary manner. It is to be understood that, other specific schemes of parts, structures, exemplary devices, systems and steps may be used, and moreover, structural and functional modification may be carried out without departing from the scope of the disclosure. Moreover, although terms such as "above", "between" and "within" may be used for describing different exemplary features and components of the disclosure in the specification, but these terms are used in the specification just for convenience, such as according to directions of examples in the drawings. Any content in the description should not be understood as falling within the scope of the disclosure only in need of a specific three-dimensional orientation of a structure. Moreover, terms such as "first" and "second" in claims are merely used as signs, but not digital limitations to its objects.

Referring to FIG. 1 to FIG. 19, schematic diagrams of manufacturing processes of a capacitive structure in the disclosure are respectively illustrated. FIG. 20 illustrates a flowchart of a manufacturing method of a capacitive structure in the disclosure. As illustrated in FIG. 20, a manufacturing method of a capacitive structure of the disclosure includes the following operations.

At S200, a semiconductor base 1 is provided.

At S400, a first mask layer 2 is formed on the semiconductor base 1, and a plurality of first round hole patterns distributed uniformly are formed on the first mask layer 2.

At S600, based on the first round hole patterns, first openings 25 distributed uniformly are formed on the semiconductor base 1 by etching, and each of the first openings 25 has a first round projection on the semiconductor base 1.

At S800, a second mask layer 3 is formed on one side, away from the semiconductor base 1, of the first openings 25, and a plurality of second patterns are formed on the second mask layer 3.

At S1000, based on the second patterns, second openings 34 distributed uniformly are formed on the semiconductor base 1 by etching, and meanwhile, the first openings 25 are continuously etched, so that the first openings 25 and the second openings 34 are same in depth.

Each of the second openings 34 has a second projection on the semiconductor base 1. Herein, a contour line of the second projection respectively intersects with contours lines of four adjacent first round projections.

At S1200, the first openings 25 and the second openings 34 are etched to form capacitive holes 4.

At S1400, a lower electrode layer, a dielectric layer and an upper electrode layer are deposited within the capacitive holes 4 to form the capacitive structure.

As the contour line of the second projection respectively intersects with the contours lines of the four adjacent first round projections, the capacitive hole 4 formed by the first opening 25 and the second opening 34 after being etched have a substantially rhombus-shaped cross section, instead of a single cylindrical structure, so that higher supporting stability can be provided, and a supporting structure of the capacitor can be effectively prevented from being broken and falling off.

The manufacturing method of the capacitive structure of the disclosure is described in detail below, and the capacitive structure in the embodiments of the disclosure is described by taking a double-sided capacitive structure as an example.

As illustrated in FIG. 1, the operation at S200 of providing the semiconductor base 1 is carried out.

The semiconductor base 1 includes a substrate 11, bonding pads, a supporting layer, a sacrificial layer and a basic mask layer 17 which are stacked in sequence, and the supporting layer and the sacrificial layer are stacked alternatively. Herein, the material of the substrate 11 may be silicon, silicon carbide, silicon nitride, silicon on insulator, stacked silicon on insulator, stacked silicon germanium on insulator, layer silicon germanium on insulator or layer germanium on insulator and the like.

A plurality of bonding pads and a Word Line (WL) and a Bit Line (BL) of a transistor are formed in the substrate 11. The plurality of bonding pads are electrically connected to a source of the transistor (not illustrated in the figure) so as to provide a circuit for a semiconductor device.

Herein, the supporting layers and the sacrificial layers are alternatively arranged, and cover the bonding pads. The sacrificial layer is arranged between the supporting layers. The supporting layers and the sacrificial layers may be formed by adopting an Atomic Layer Deposition (ALD) process or a Chemical Vapor Deposition (CVD) process. The material of the supporting layer may include silicon nitride, silicon oxide or silicon oxynitride, and the material of the sacrificial layer may include silicon nitride, silicon oxide or silicon oxynitride. The supporting layer and the sacrificial layer are made of different materials. In the embodiment, the material of the supporting layer is SiN, and the material of the sacrificial layer is SiO2. Therefore, in the same corrosive liquid, the corrosion rates of the supporting layer and the sacrificial layer are different. Specifically, in the same corrosive liquid, the corrosion rate of the sacrificial layer is far greater than the corrosion rate of the supporting layer, so that the supporting layer is nearly retained completely when the sacrificial layer is completely removed. The corrosive liquid may be a concentrated hydrofluoric acid solution.

In the embodiment, two layers, each of which includes the supporting layer and the sacrificial layer, are arranged, namely a first supporting layer 12, a first sacrificial layer 13, a second supporting layer 14, a second sacrificial layer 15 and a third supporting layer 16. Certainly, three, four or five alternative layers of the supporting layer and the sacrificial layer may also be arranged. Those skilled in the art may perform selection according to actual demands, which is not specially limited here.

One or more basic mask layers 17 may be arranged. For example, in the embodiment, two basic mask layers 17, respectively a first basic mask layer 171 and a second basic mask layer 172, are arranged. Certainly, three, four or five layers may also be arranged, and those skilled in the art may perform selection according to actual demands, which is not specially limited here. Patterns of the first openings 25 and the second openings 34 may be transferred onto the basic mask layer 17 so as to form patterns of the capacitive holes. Then, the patterns of the capacitive holes are transferred onto the semiconductor base located below the basic mask layer 17, and etching is continuously carried out, so that the capacitive holes are finally formed. Moreover, the material of the basic mask layer 17 is silicon oxide, silicon nitride, polycrystalline silicon or other materials or combinations thereof generally.

Figure 2:
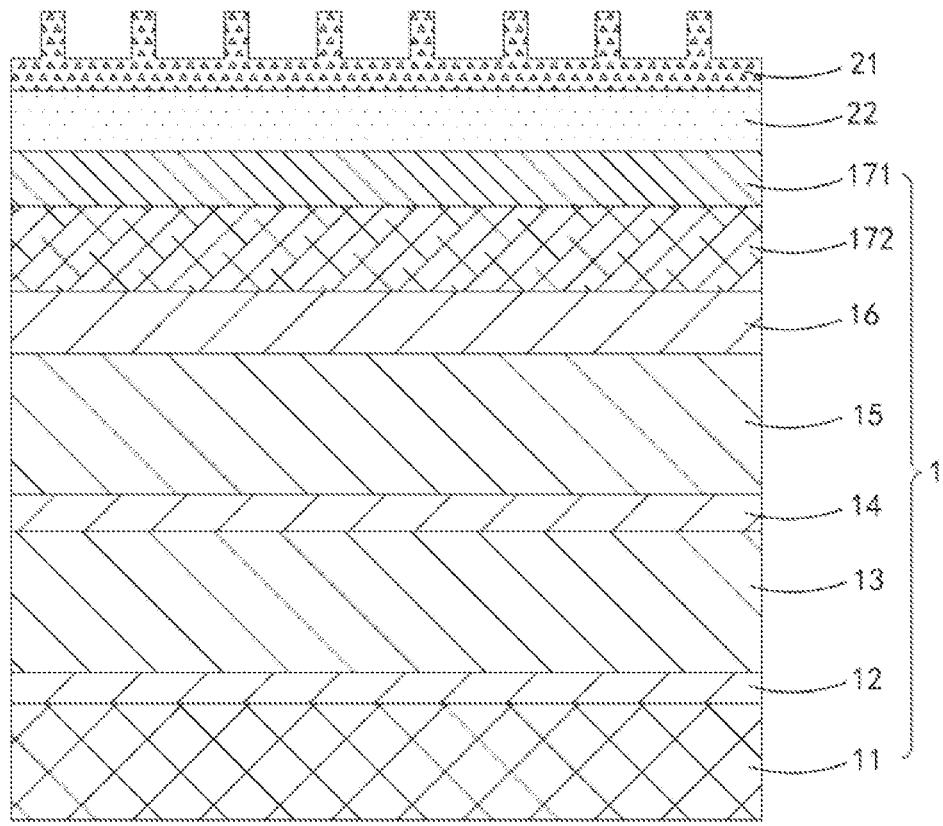
FIG. 2 is a schematic structural diagram of forming a first line in a manufacturing method of a capacitive structure in an exemplary embodiment of the disclosure.
Figure 3:
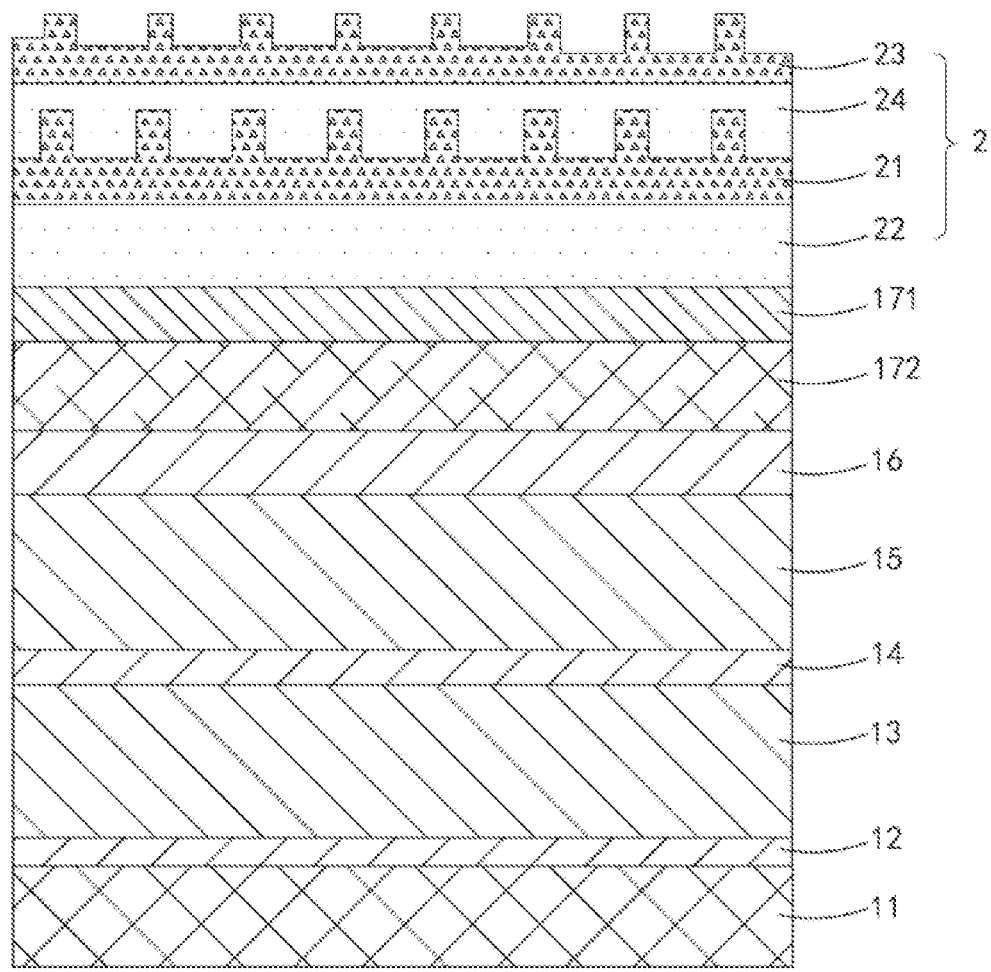
FIG. 3 is a schematic structural diagram of forming a second line in a manufacturing method of a capacitive structure in an exemplary embodiment of the disclosure.

As illustrated in FIG. 2 to FIG. 3, the operation at S400 of forming the first mask layer 2 on the semiconductor base 1 and forming the plurality of first round hole patterns distributed uniformly on the first mask layer 2 is carried out.

Specifically, as illustrated in FIG. 2 and FIG. 3, the operation of forming the first mask layer 2 includes: a first hard mask layer 21 and a second hard mask layer 23 are deposited on the semiconductor base 1 in sequence.

As illustrated in FIG. 2, the first hard mask layer 21 is deposited on the semiconductor base 1, specifically deposited on a surface of the first basic mask layer 171 located on the semiconductor base 1. Preferably, before the first hard mask layer 21 is deposited, a first organic material layer 22 may also be deposited on the semiconductor base, namely the first basic mask layer 171. A plurality of parallel first lines are formed on the first hard mask layer 21 along a first direction. The first lines are arranged in parallel and at intervals. Moreover, the spacings between adjacent two first lines are same, and the spacings are first spacings.

As illustrated in FIG. 3, the second hard mask layer 23 is deposited on the first hard mask layer 21. Preferably, before the second hard mask layer 23 is deposited, a second organic material layer 24 may be deposited on the first hard mask layer 21 at first, and then, the second hard mask layer 23 is deposited on the second organic material layer 24. A plurality of parallel second lines at intervals are formed on the second hard mask layer 23 along a second direction. The spacings between adjacent two second lines are same, and the spacings are second spacings. Herein, the first direction and the second direction intersect, that is, the two directions are not parallel. Therefore, the first lines and the second lines have a plurality of intersection points. Etching is carried out at the intersection points, so that the first round hole patterns are formed.

Because the first spacing and the second spacing are same, the first lines and the second lines may form a square or a rhombus after intersecting. Certainly, the first spacing may be different from the second spacing, therefore, after the two types of lines intersect, a plurality of rectangles or parallelograms may be formed, and the first round hole patterns are distributed at four vertexes.

The materials of the first hard mask layer 21 and the second hard mask layer 23 are silicon oxide, silicon nitride, polycrystalline silicon or other materials and a combination thereof generally. The first round hole patterns may be formed by etching the hard mask layer through plasma.

Figure 4:
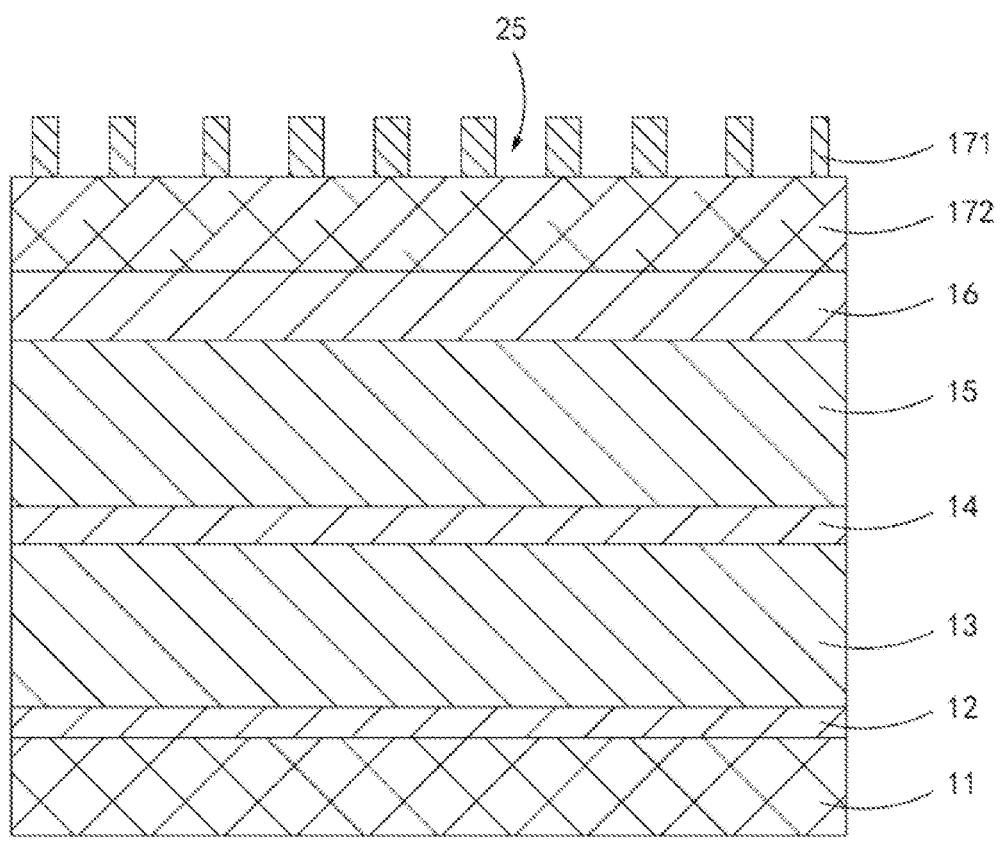
FIG. 4 is a schematic structural diagram of forming a first opening in a manufacturing method of a capacitive structure in an exemplary embodiment of the disclosure.
Figure 5:
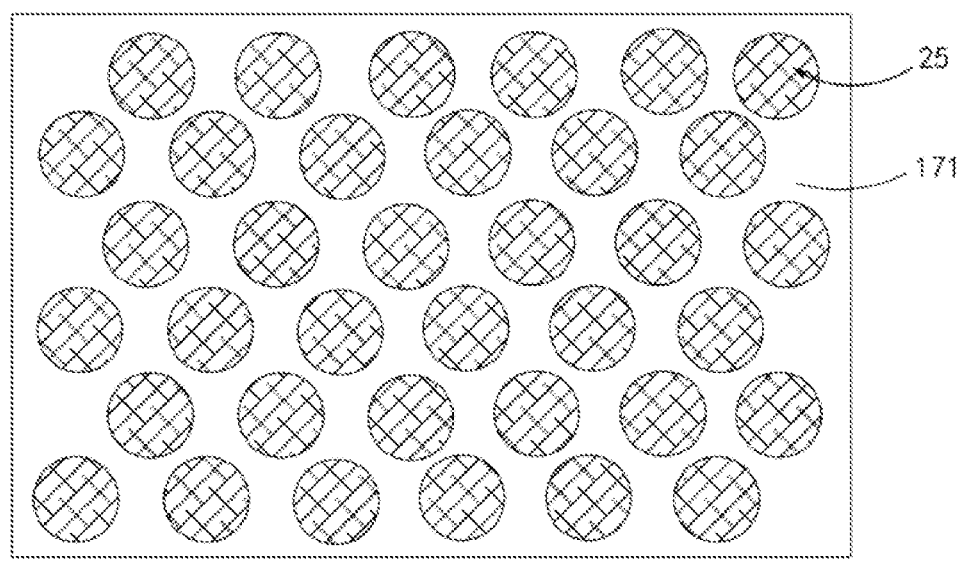
FIG. 5 is a top view of FIG. 4.

Afterwards, as illustrated in FIG. 4 and FIG. 5, the operation at S600 of forming the first openings 25 distributed uniformly on the semiconductor base 1 by etching based on the first round hole patterns is carried out.

As illustrated in FIG. 4, the depth of each first opening 25 is the thickness of the first basic mask layer 171 at the uppermost layer of the semiconductor base 1. That is, the first basic mask layer 171 is etched, so that the pattern of the first opening 25 is obtained. Each first opening 25 is a round hole, as illustrated in FIG. 5, the cross sectional contour of the first opening 25 is round. Continuously referring to FIG. 5, a projection of each first opening 25 on the semiconductor base 1 (the second basic mask layer 172 at this time) is defined as a first round projection.

Figure 6:
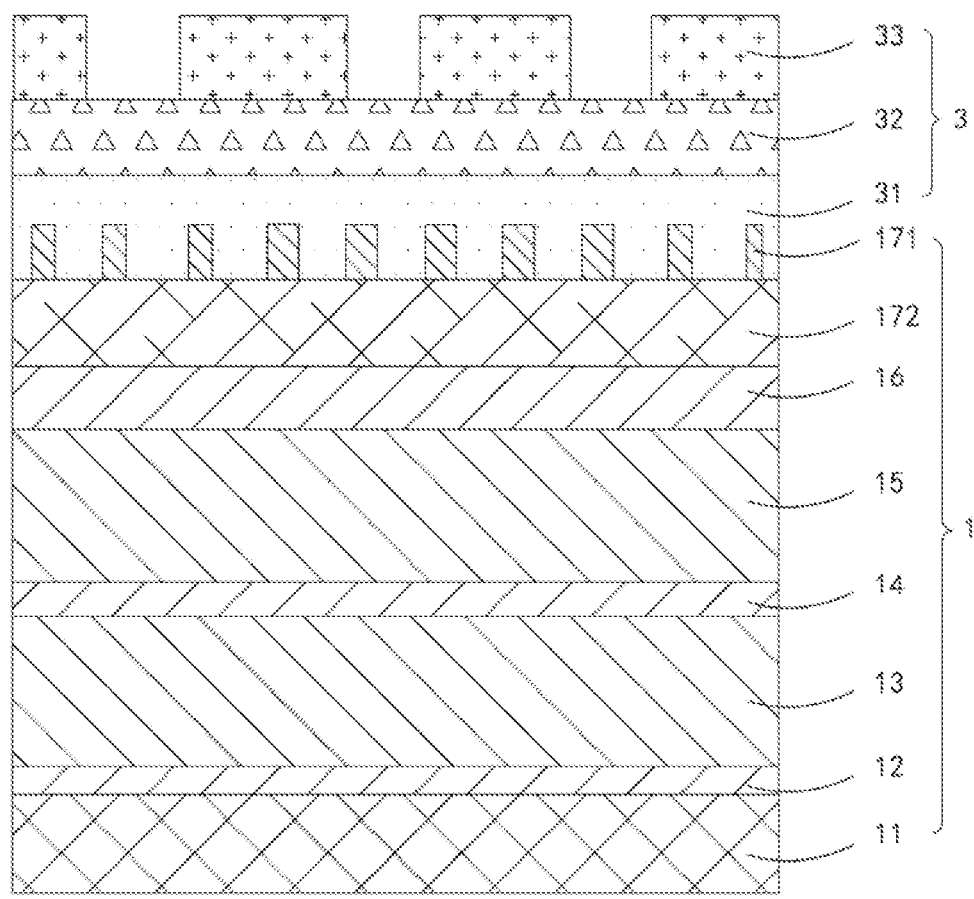
FIG. 6 is a schematic structural diagram of setting a second mask layer in a manufacturing method of a capacitive structure in an exemplary embodiment of the disclosure.
Figure 7:
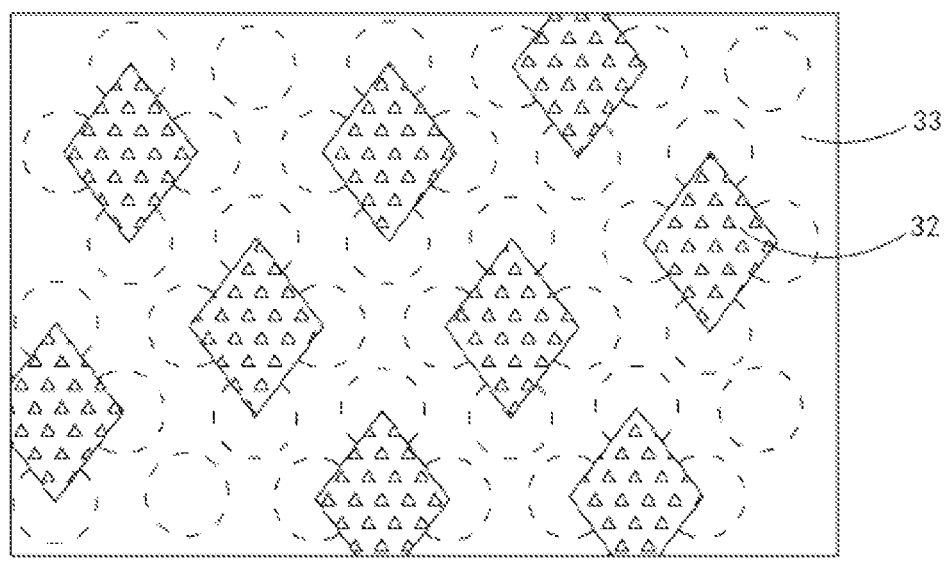
FIG. 7 is a schematic top view of FIG. 6.

Then, as illustrated in FIG. 6 to FIG. 7, the operation at S800 of forming the second mask layer 3 on one side, away from the semiconductor base 1, of the first openings 25, and forming a plurality of second patterns on the second mask layer 3 is carried out.

Specifically, as illustrated in FIG. 6, the second mask layer 3 is deposited on one side, away from the semiconductor base 1, of the first openings 25, namely, on the top end of each first opening 25. For example, the second mask layer 3 is formed through ALD or CVD. The operation of forming the second mask layer 3 by deposition may include: a third organic material layer 31, a third hard mask layer 32 and a first photoresist layer 33 formed by deposition are stacked in sequence, then the photoresist layer is etched through an exposure process and a developing process to form a photoresist pattern, and afterwards, the third hard mask layer 32 is etched by taking the photoresist pattern as an etching mask to form the second patterns.

The second pattern may be a quadrangle, such as a rhombus and a parallelogram, or may be an ellipse. An outer contour of the ellipse intersects with four adjacent first round projections. As illustrated in FIG. 7, the second pattern is a rhombus, which is located in the middle of the first round projections of four first openings 25, and has an overlapped part with the four round projections respectively.

Figure 8:
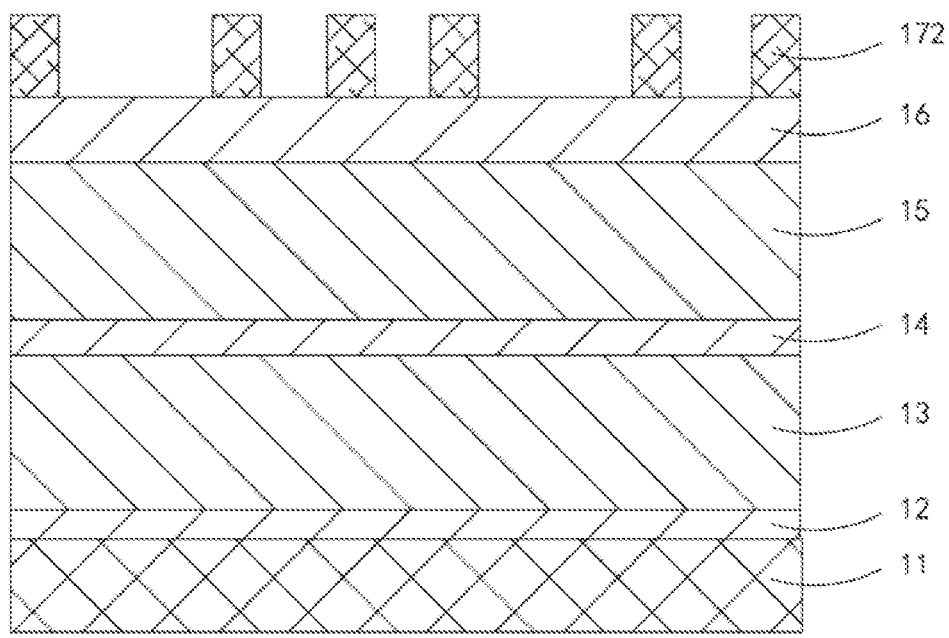
FIG. 8 is a schematic structural diagram of forming a capacitive hole in a manufacturing method of a capacitive structure in an exemplary embodiment of the disclosure.
Figure 9:
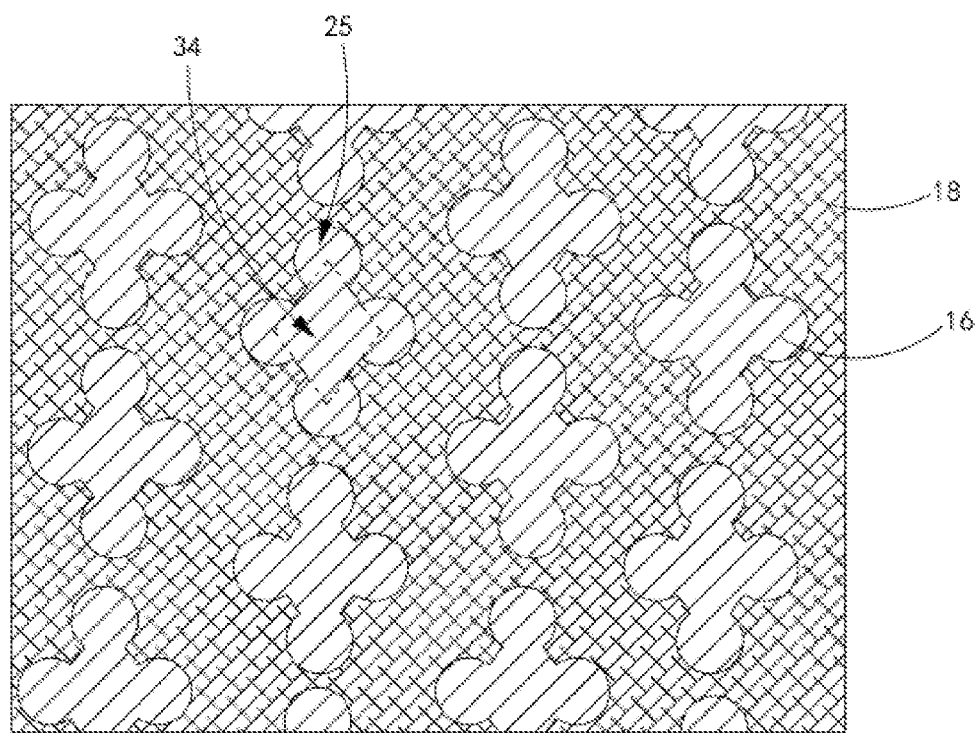
FIG. 9 is a top view of FIG. 8.

Afterwards, as illustrated in FIG. 8 to FIG. 9, the operation at S1000 of forming the second openings 34 distributed uniformly on the semiconductor base 1 by etching based on the second patterns, and meanwhile continuously etching the first opening 25s, so that the first opening 25s and the second opening 34s are same in depth, is carried out.

Figure 11:
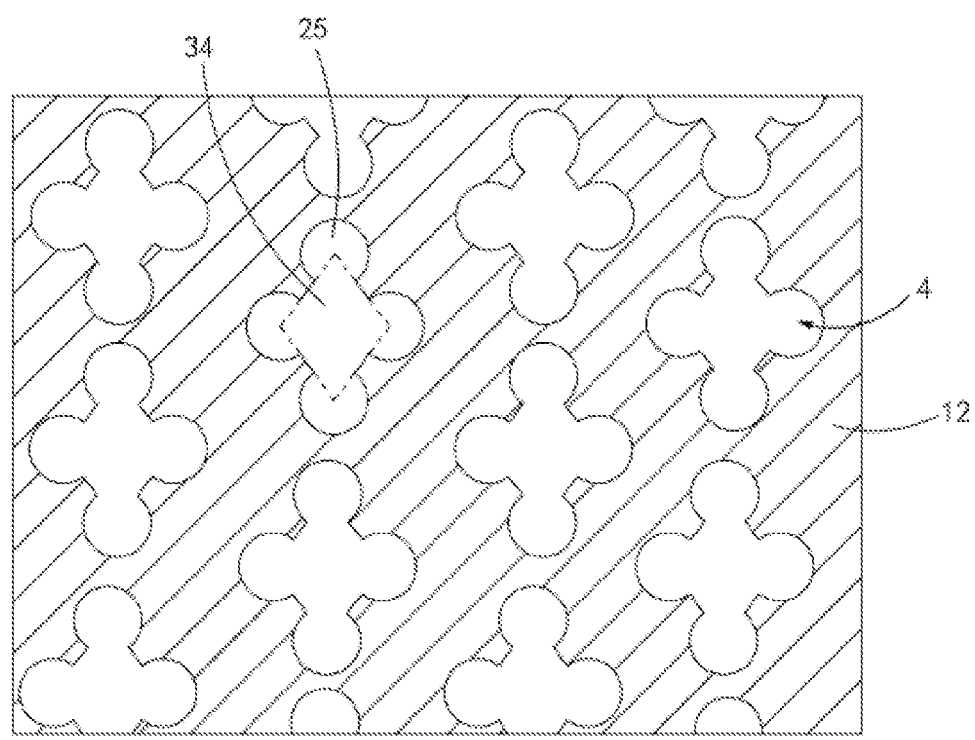
FIG. 11 is a schematic top view of FIG. 10.

As illustrated in FIG. 8 and FIG. 9, the pattern of the second mask layer 3 is transferred onto the second basic mask layer 172 of the semiconductor base 1, and the second basic mask layer 172 is continuously etched, as illustrated in the dotted lines of the rhombus in FIG. 11, so that the second opening 34 is formed. That is, the second pattern is transferred onto the second basic mask layer 172 to form a pattern of the second opening 34. Each of the second openings 34 is defined to be provided with a second projection on the semiconductor base 1. In the previous operation, each first opening 25 has been defined to be provided with a first round projection on the semiconductor base 1. As illustrated in FIG. 5 and FIG. 11, connecting lines of circle centers of the four first round projections form a rhombus, and a contour line of each second projection respectively intersects with contours lines of the four first round projections.

As the first opening 25 and the second opening 34 are etched at the same time in the etching process, and the first opening 25 and the second opening 34 are penetrated with each other as a whole actually, the first opening 25 and the second opening 34 may form a pattern of a capacitive hole 4. It can be seen from FIG. 11 that, as the pattern of each capacitive hole 4 includes four first openings 25, and connecting lines of circle centers of the four first openings 25 form a rhombus, the contour shape of the cross section of the capacitive hole 4 is roughly of a rhombus-shaped structure.

It is to be noted that, the first opening 25 and the second opening 34 have been partly overlapped while the second opening 34 is formed, so that the pattern of the capacitive hole 4 is formed while the second opening 34 is formed due to the fact that the first opening 25 and the second opening 34 are penetrated, and the second opening 34 with a rhombus-shaped or elliptical cross section may not be formed independently. Therefore, in order to facilitate the understanding, the first opening 25 and the second opening 34 are independently listed and described in the embodiment of the disclosure. In FIG. 11, the overlapped part of the second opening 34 and the first opening 25 is indicated by a dotted line.

Figure 10:
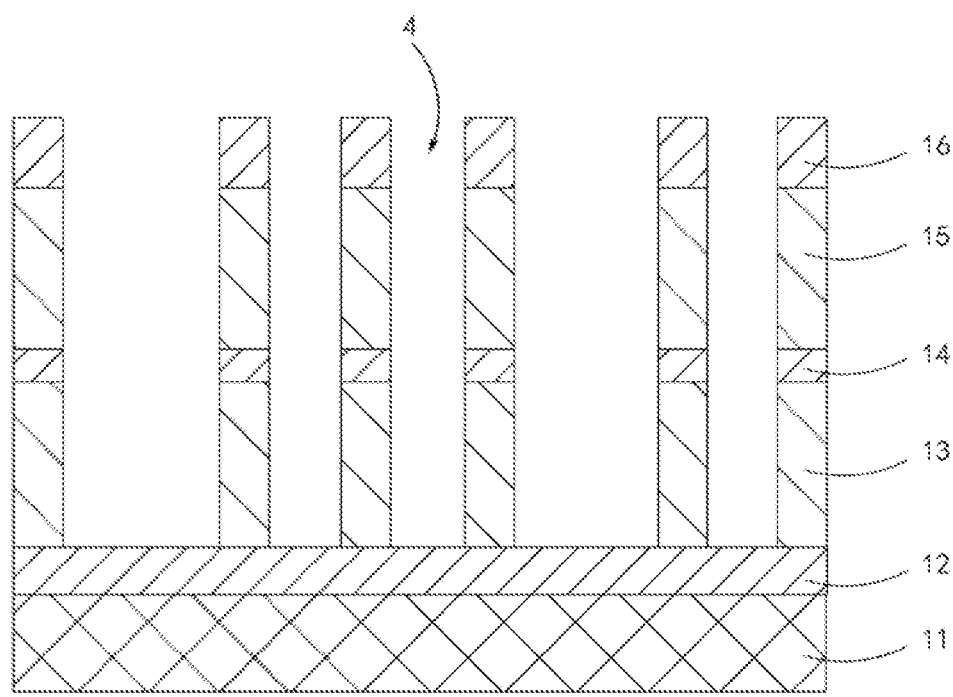
FIG. 10 is a schematic structural diagram of forming a capacitive hole in a manufacturing method of a double-sided capacitor with a triangle supporting structure in the disclosure.

Afterwards, as illustrated in FIG. 10 to FIG. 11, the operation at S1200 of etching the first openings 25 and the second openings 34 to form the capacitive holes 4 is carried out.

In the embodiment, as illustrated in FIG. 8 and FIG. 10, the pattern of the capacitive hole 4 of the second basic mask layer 172 is transferred onto the third supporting layer 16, and etching is continuously carried out to reach the bottommost supporting layer of the semiconductor base 1 to form the capacitive hole 4. The bottommost supporting layer is the first supporting layer 12, and the bonding pads are arranged in the first supporting layer 12, so that the capacitive holes 4 in the embodiment may be etched to the bonding pads. In this way, the side circumferential wall of the capacitive hole 4 is provided with the first sacrificial layer 13, the second supporting layer 14, the second sacrificial layer 15 and the third supporting layer 16 from bottom to top in sequence.

Afterwards, as illustrated in FIG. 12 to FIG. 17, the operation at S1400 of depositing the lower electrode layer, the dielectric layer and the upper electrode layer within the capacitive holes 4 to form a stable capacitive structure is carried out.

Figure 12:
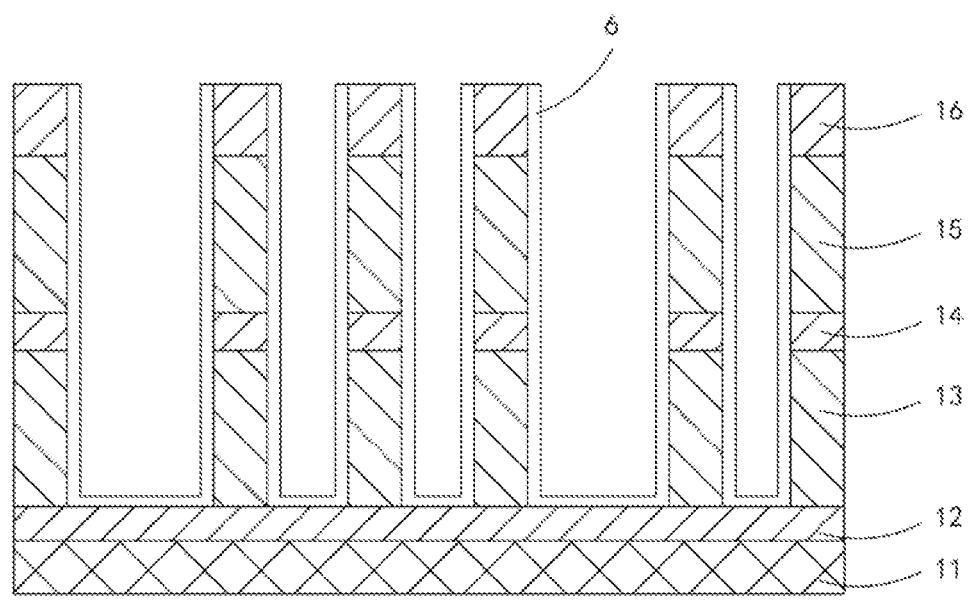
FIG. 12 is a schematic structural diagram of forming a conductive layer in a capacitive hole in a manufacturing method of a capacitive structure in an exemplary embodiment of the disclosure.
Figure 13:
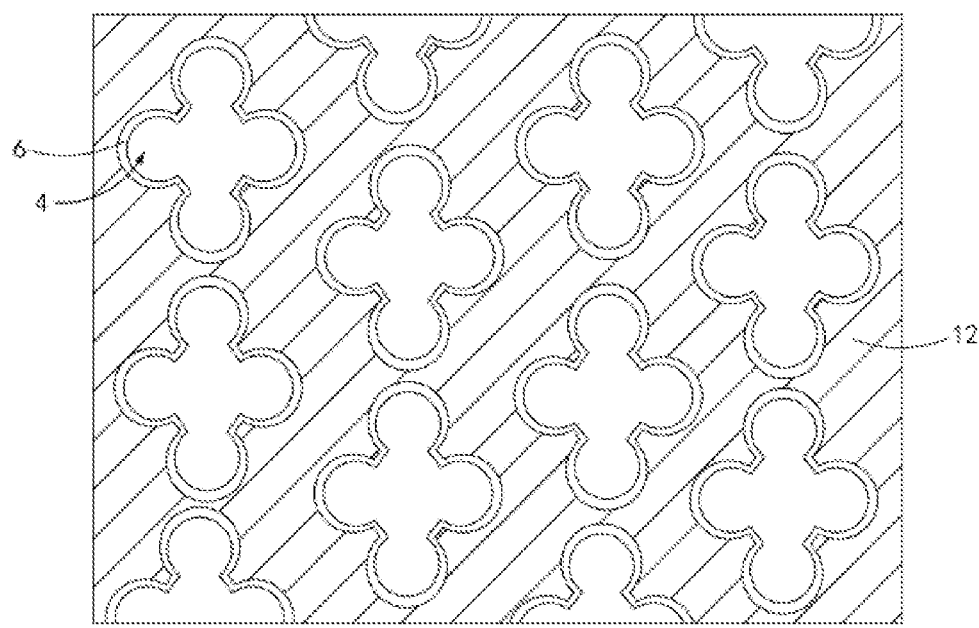
FIG. 13 is a top view of FIG. 12.

Specifically, as illustrated in FIG. 12 to FIG. 13, the lower electrode layer 6 is formed on an inner surface of the side circumferential wall of each capacitive hole 4 and a bottom surface of the capacitive hole 4 through a deposition method. That is, the lower electrode layer 6 is attached to an inner wall of the capacitive hole 4 and the first supporting layer 12 or bonding pad that forms the bottom surface of the capacitive hole 4, and the lower electrode layer 6 is not formed on the top end of the side circumferential wall of the capacitive hole 4.

Figure 14:
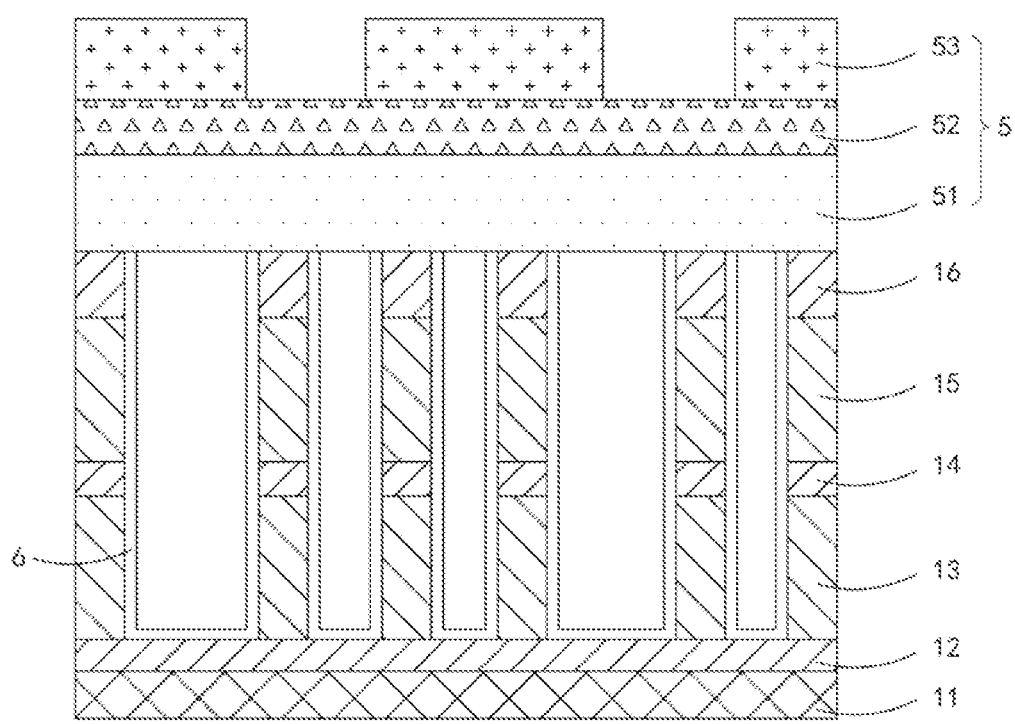
FIG. 14 is a schematic structural diagram of forming a conductive layer in a manufacturing method of a capacitive structure in an exemplary embodiment of the disclosure.
Figure 15:
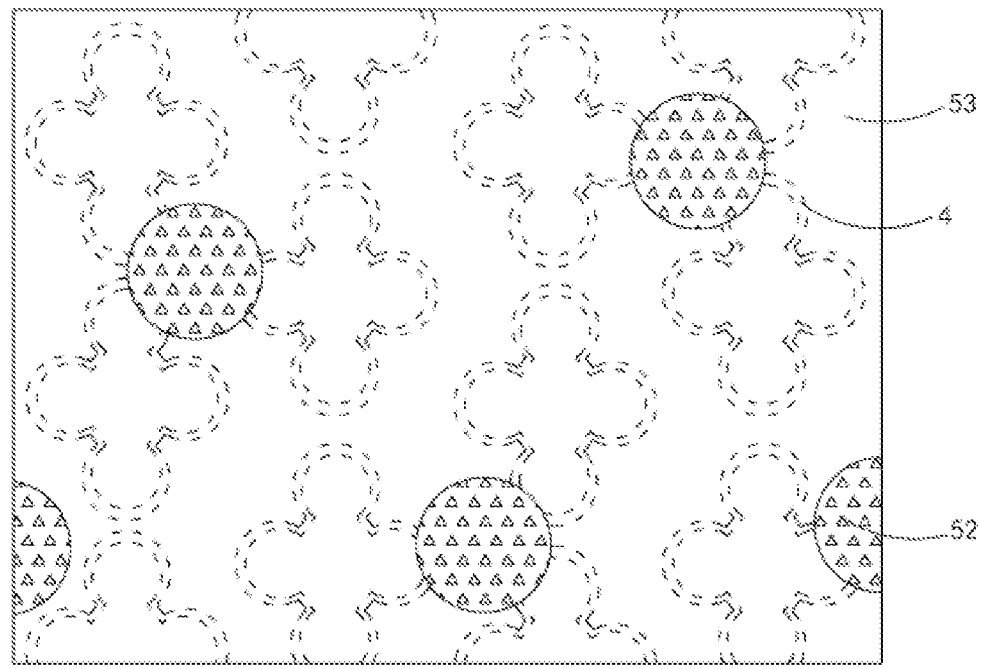
FIG. 15 is a schematic top view of FIG. 14.

Afterwards, as illustrated in FIG. 14 to FIG. 15, a third mask layer 5 is formed on the top of the capacitive holes 4, and third round hole patterns are formed on the third mask layer 5. A projection of each third round hole pattern on the semiconductor base 1 is defined as a third round projection, a projection of each capacitive hole 4 on the semiconductor base 1 is defined as a capacitive hole projection. In this way, each third round projection partially overlaps at least two adjacent capacitor hole projections respectively. For example, a contour line of each third projection intersects with contour lines of two or three adjacent capacitor hole projections. Alternatively, a contour line of each third projection intersects with contours of four adjacent capacitor hole projections, the third projection is located in the middle of the four capacitive hole projections, and the contour line of each capacitor hole projection intersects with the contour line of one third projection. Etching is carried out based on the third round hole patterns of the third mask, the third supporting layer 16, which is on the top of the side circumferential wall of the capacitive hole 4 and overlapped with the third round hole patterns may be removed. That is, the supporting layer on the top of part of the side circumferential wall of the capacitive hole 4 is removed.

Specifically, as illustrated in FIG. 14, the operation of forming the third mask layer 5 includes: a fourth organic material layer 51, a fourth hard mask layer 52 and a second photoresist layer 53 are deposited in sequence, so that the three form a stacked structure. The second photoresist layer 53 is etched through an exposure process and a developing process to form a photoresist pattern. Then, the fourth hard mask layer 52 is etched by taking the photoresist pattern as an etching mask to form a third round hole pattern.

Figure 16:
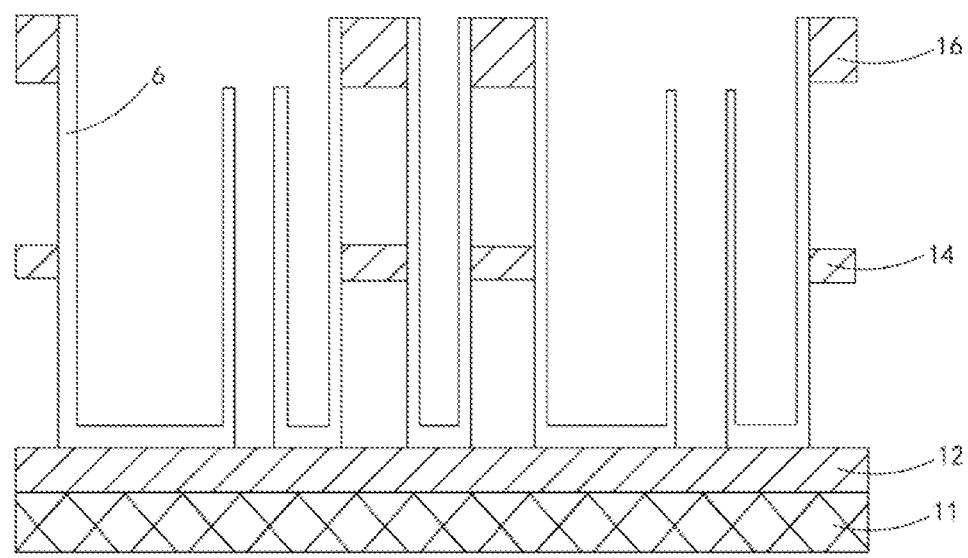
FIG. 16 is a schematic diagram after removing a sacrificial layer between a supporting layer on a top of part of a side circumferential wall of a capacitive hole and a lower electrode layer in a manufacturing method of a capacitive structure in an exemplary embodiment of the disclosure.
Figure 17:
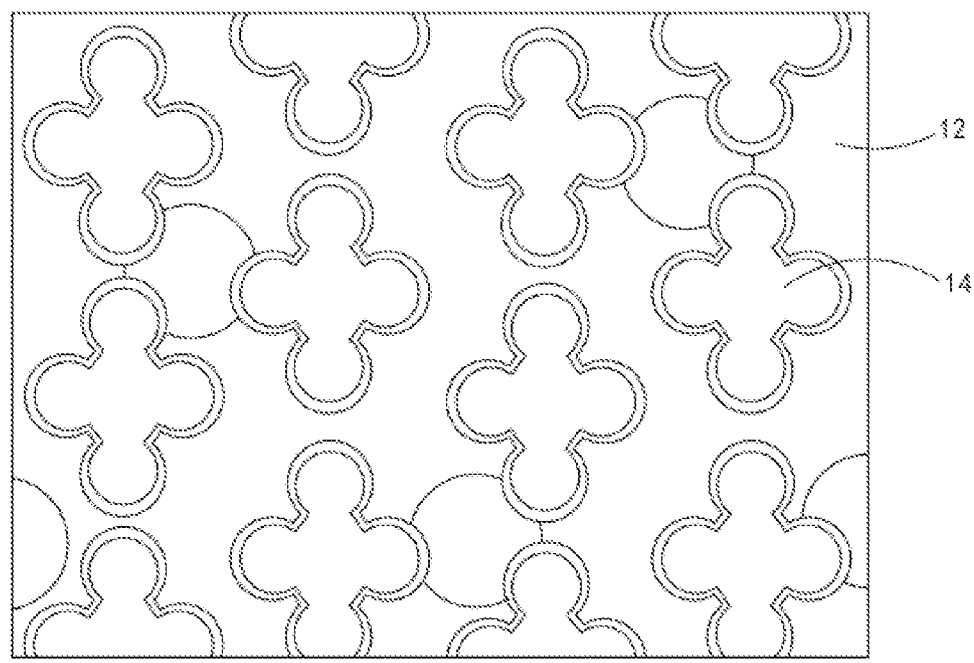
FIG. 17 is a schematic top view of FIG. 16.

Afterwards, as illustrated in FIG. 16 to FIG. 17, the side circumferential wall of the capacitive hole 4 (attached to the lower electrode layer 6 at this time) is continuously etched, so that the first sacrificial layer 13 and the second sacrificial layer 15 in the side circumferential wall of the capacitive hole 4 are removed. The concentrated hydrofluoric acid solution may be used as an etching reagent. After etching is completed, the side circumferential wall of the capacitive hole 4 includes the lower electrode layer 6, the second supporting layer 14 and the third supporting layer 16, and a bottom wall of the capacitive hole 4 includes the lower electrode layer 6 and is deposited on the first supporting layer 12.

Figure 18:
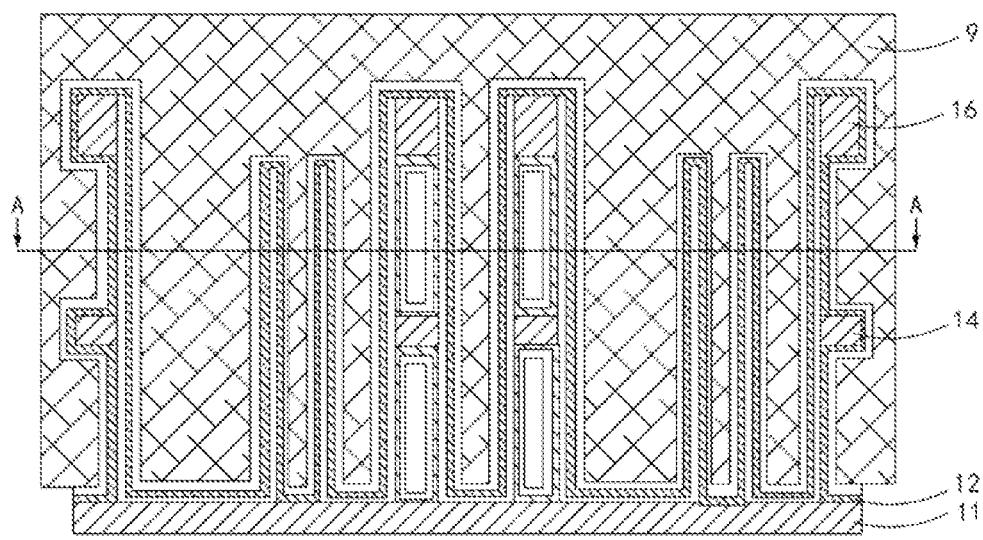
FIG. 18 is a schematic structural diagram of a capacitor formed in an exemplary embodiment of the disclosure.
Figure 19:
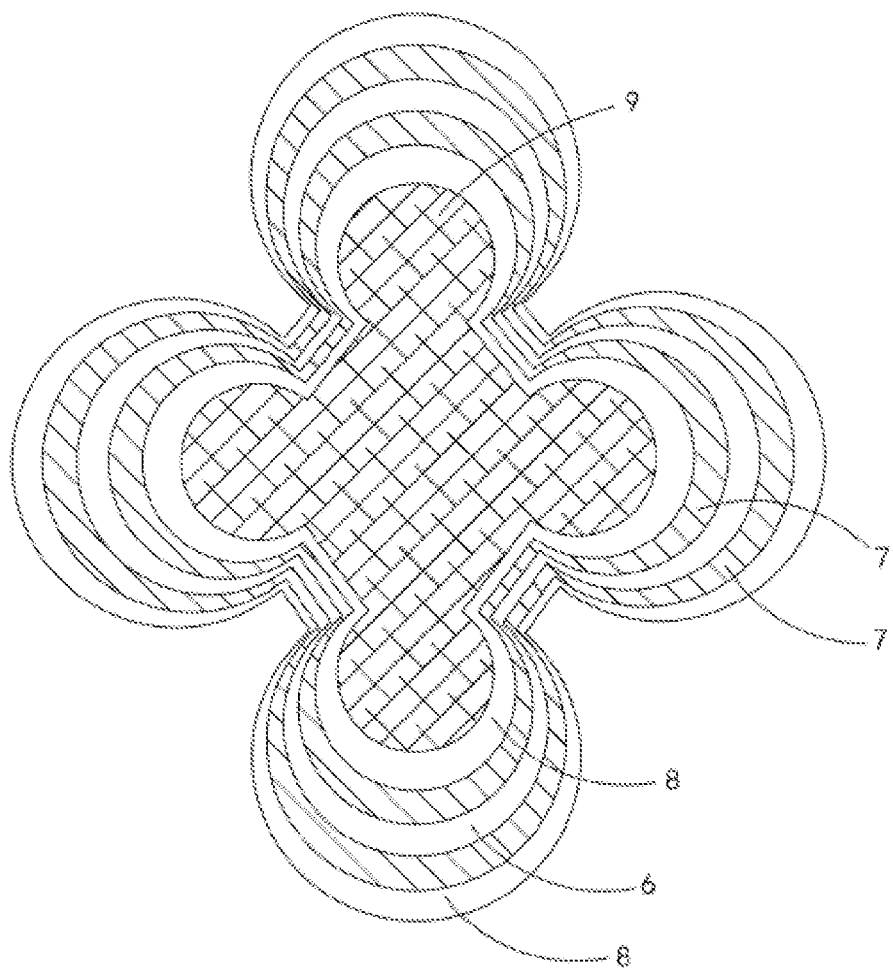
FIG. 19 is a sectional schematic diagram of one of capacitive holes along A-A in FIG. 18.
Figure 20:
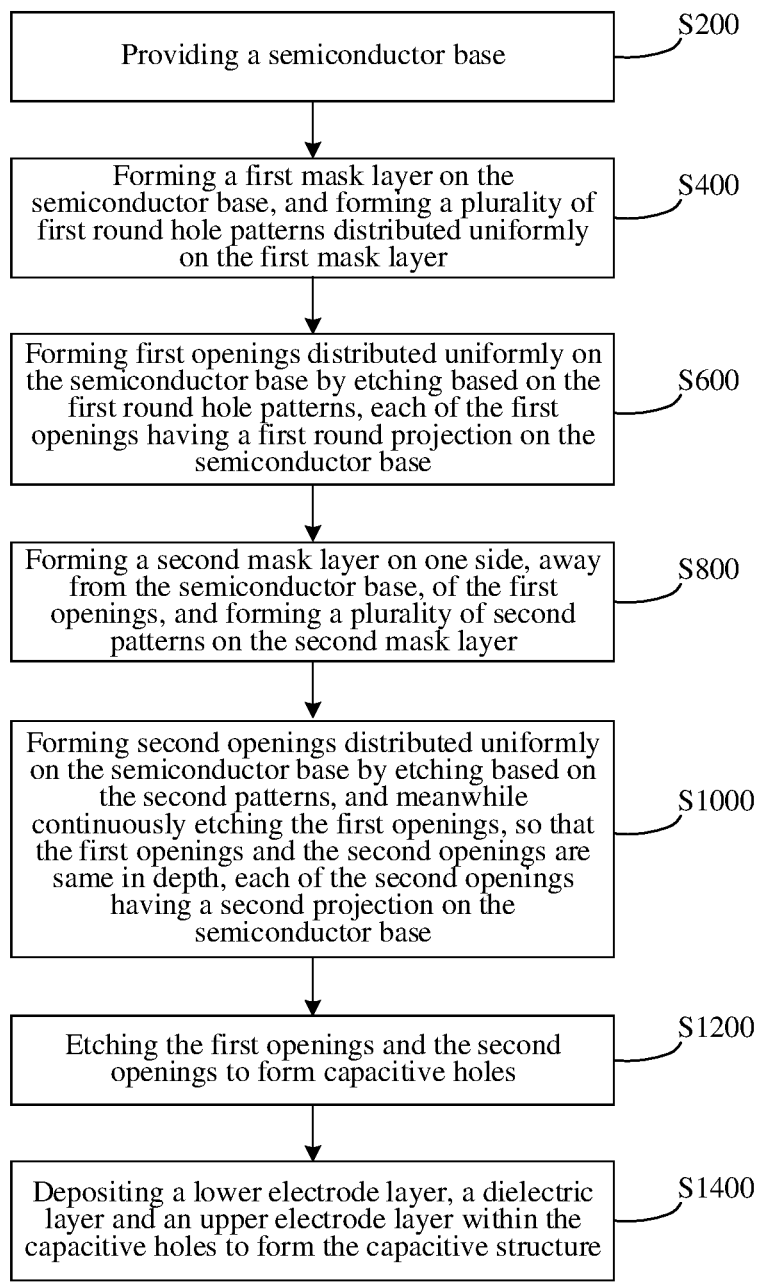
FIG. 20 is a flowchart of a manufacturing method of a capacitive structure of the disclosure.

Afterwards, as illustrated in FIG. 18 to FIG. 19, the dielectric layer is formed, the dielectric layer covering the lower electrode layer 6 and the exposed semiconductor base 1. Specifically, a dielectric layer 7 is formed on the lower electrode layer 6 of the side circumferential wall, the top of the third supporting layer 16 on the top of the side circumferential wall and the exposed first supporting layer 12 by deposition. The dielectric layer 7 uses a high-K medium to increase a capacitance value per unit area of the capacitor. The material of the dielectric layer 7 may include at least one of ZrOx, HfOx, ZrTiOx, RuOx, SbOx or AlOx, and the dielectric layer 7 may also include a plurality of layers stacked by different materials. Afterwards, an upper electrode layer 8 is formed on the dielectric layer 7 in a covering manner. The material of the upper electrode layer 8 may be the same as the material of the lower electrode layer 6, and may include at least one of metal nitride and metal silicide, such as titanium nitride, titanium silicide and nickel silicide. The upper electrode layer 8 is formed on the dielectric layer 7 still by adopting the ALD process or the CVD process.

An electric conductor 9 is formed within the capacitive hole 4, and includes a stacked layer which is formed by at least one of tungsten, titanium, nickel, aluminum, platinum, titanium nitride, N type polycrystalline silicon and P type polycrystalline silicon.

Therefore, the lower electrode layer 6, the dielectric layer 7 and the upper electrode layer 8 in the disclosure can form a side circumferential wall of the capacitive hole 4, and the side circumferential wall can form a supporting structure of the capacitor. It can be seen from FIG. 19 that, the shape of the cross section of the capacitive hole 4 is similar to a rhombus-shaped structure, that is, connecting lines of circle centers of respective protruding parts form a rhombus, so that a rhombus-shaped supporting structure is formed.

In conclusion, as the connecting lines of the circle centers of the first round projections of the four first openings 25 form a quadrangle, and the contour line of the second projection respectively intersects with the contours lines of the four first round projections, the capacitive hole 4 formed by the first opening 25 and the second opening 34 after being etched is a quadrangular structure, specifically a rhombus-shaped structure, but not a single cylindrical structure, so that higher supporting stability can be provided, and the supporting structure can be effectively prevented from being broken and falling off.

According to another aspect of the disclosure, a capacitor is provided, which is manufactured by the manufacturing method in the above embodiments. The capacitor may be a double-sided capacitor. The capacitor includes: a semiconductor base 1, capacitive holes 4, and a lower electrode layer 6, a dielectric layer 7 and an upper electrode layer 8 which are deposited in each capacitive hole in sequence. The capacitive holes 4 are arranged in the semiconductor base 1, and arranged in an array mode.

Each of the capacitive holes 4 is formed by four adjacent round first openings 25 and one second opening 34. A projection of each of the first openings 25 on the semiconductor base 1 is a first round projection, a projection of the second opening 34 on the semiconductor base 1 is a second projection, a contour line of the second projection respectively intersects with contours lines of the four adjacent first round projections. A continuous outer contour of the first round projection and the second projection forms a projection contour of the capacitive hole 4 on the semiconductor base 1.

Connecting lines of circle centers of the four adjacent round projections form one quadrangle. In the embodiment, the quadrangle may be a rhombus, the four vertices of each second projection is overlapped with the circle centers of the four adjacent first round projections, so that the capacitive hole 4 has a symmetrical structure, thereby being favorable for improving the supporting stability thereof.

Moreover, as illustrated in FIG. 18 and FIG. 19, the double-sided capacitor may also include an electric conductor 9, which is filled in the capacitive holes 4.

The specific structure and the material of the capacitor are the same as that in the embodiments of the manufacturing method, which is not elaborated herein.

In conclusion, as the capacitive hole of the double-sided capacitor in the disclosure is a triangular structure, higher stability can be provided, the supporting structure is effectively prevented from being broken and falling off, and the demand of continuous miniaturization of a semiconductor device can be met.

It should be understood that, application of the disclosure does not be limited to detailed structures and arrangement modes of parts disclosed by the specification. The disclosure may have other implementation modes, and may realize and execute the implementation modes in many forms. The foregoing modifications and improvements shall fall within the scope of the disclosure. It can be understood that, the disclosure disclosed and limited in the specification extends to all replaceable combinations of the above in the test and/or the drawings or obvious two or more independent features. All these different combinations form multiple replaceable aspects of the disclosure. All the implementation modes of the specification illustrate the known best mode for realizing the disclosure, and furthermore, those skilled in the art can utilize the disclosure.

The invention claimed is:

1. A manufacturing method of a capacitive structure, comprising:
   providing a semiconductor base;
   forming a first mask layer on the semiconductor base, and forming a plurality of first round hole patterns distributed uniformly on the first mask layer;
   forming first openings distributed uniformly on the semiconductor base by etching based on the first round hole patterns, each of the first openings having a first round projection on the semiconductor base;
   forming a second mask layer on one side, away from the semiconductor base, of the first openings, and forming a plurality of second patterns on the second mask layer;
   forming second openings distributed uniformly on the semiconductor base by etching based on the second patterns, and meanwhile continuously etching the first openings, so that the first openings and the second openings are same in depth, each of the second openings having a second projection on the semiconductor base;
   wherein a contour line of the second projection respectively intersects with contours lines of four adjacent first round projections;
   etching the first openings and the second openings to form capacitive holes; and
   depositing a lower electrode layer, a dielectric layer and an upper electrode layer within the capacitive holes to form the capacitive structure.

2. The manufacturing method according to claim 1, wherein the second projection is a quadrangle, and four vertices of the quadrangle are respectively located within four adjacent first round projections.

3. The manufacturing method according to claim 1, wherein the semiconductor base comprises:
   a substrate;
   bonding pads, arranged on the substrate;

a plurality of supporting layers and sacrificial layers which are stacked alternatively and cover the bonding pad, wherein a sacrificial layer is arranged between the supporting layers; and a basic mask layer, arranged on a supporting layer farthest from the substrate.

4. The manufacturing method according to claim 3, wherein the supporting layers and the sacrificial layers are formed through an Atomic Layer Deposition (ALD) process or a Chemical Vapor Deposition (CVD) process.

5. The manufacturing method according to claim 3, wherein the material of the supporting layers is SiN, and the material of the sacrificial layers is $SiO_2$.

6. The manufacturing method according to claim 1, wherein the first mask layer comprises:

a first hard mask layer, a plurality of parallel first lines being formed on the first hard mask layer along a first direction; and a second hard mask layer arranged on the first hard mask layer, a plurality of parallel second lines being formed on the second hard mask layer along a second direction;

wherein the first direction and the second direction intersect, the first lines and the second lines have a plurality of intersection points, and etching is carried out at the intersection points to form the first round hole patterns.

7. The manufacturing method according to claim 6, wherein spacings between adjacent two first lines are same and are first spacings, spacings between adjacent two second lines are same and are second spacings, and a first spacing is equal to a second spacing.

8. The manufacturing method according to claim 6, wherein the first hard mask layer and the second hard mask layer are sequentially deposited on the semiconductor base.

9. The manufacturing method according to claim 8, wherein before the first hard mask layer is deposited, a first organic material layer is deposited on the semiconductor base.

10. The manufacturing method according to claim 9, wherein before the second hard mask layer is deposited, a second organic material layer is deposited on the first hard mask layer.

11. The manufacturing method according to claim 6, wherein the materials of the first hard mask layer and the second hard mask layer are at least one of silicon oxide, silicon nitride or polycrystalline silicon.

12. The manufacturing method according to claim 1, wherein forming the second mask layer on one side, away from the semiconductor base, of the first openings, and forming the plurality of second patterns on the second mask layer comprises:

stacking a third organic material layer, a third hard mask layer and a first photoresist layer on a top end of the first openings in sequence by deposition;

etching the first photoresist layer through an exposure process and a developing process to form a photoresist pattern; and etching the third hard mask layer by taking the photoresist pattern as an etching mask to form the second patterns.

13. The manufacturing method according to claim 12, wherein a second pattern is a rhombus and located in a middle of first round projections of four first openings, and the second pattern has an overlapped part with the four first round projections respectively.

14. The manufacturing method according to claim 3, wherein depositing the lower electrode layer, the dielectric layer and the upper electrode layer in the capacitive holes to form the capacitive structure comprises:

forming the lower electrode layer on an inner surface of a side circumferential wall of each capacitive hole and a bottom surface of the capacitive hole, the lower electrode layer being connected to the bonding pad;

forming a third mask layer on a top of the capacitive hole, and forming third round hole patterns on the third mask layer;

removing a supporting layer on a top of part of side circumferential wall of the capacitive hole based on the third round hole patterns; and etching the capacitive hole to remove a sacrificial layer between the lower electrode layers.

15. The manufacturing method according to claim 14, wherein forming the third mask layer on the top of the capacitive hole, and forming the third round hole patterns on the third mask layer comprises:

sequentially depositing a fourth organic material layer, a fourth hard mask layer and a second photoresist layer, to form a stacked structure;

etching the second photoresist layer through an exposure process and a developing process to form a photoresist pattern; and etching the fourth hard mask layer by taking the photoresist pattern as an etching mask to form the third round hole patterns.

16. The manufacturing method according to claim 14, wherein a projection of a third round hole pattern on the semiconductor base is a third round projection, a projection of the capacitive hole on the semiconductor base is a capacitive hole projection, and wherein the third round projection intersects with contours of at least two adjacent capacitive hole projections, etching is carried out based on the third round hole patterns, and a supporting layer which is on the top of the side circumferential wall of the capacitive hole and corresponds to the third round hole patterns is removed.

17. The manufacturing method according to claim 14, wherein the semiconductor base comprises two layers in each of which a supporting layer and a sacrificial layer are stacked, and the sacrificial layer between the lower electrode layers is removed by utilizing a hydrofluoric acid solution.

18. The manufacturing method according to claim 17, wherein the material of the supporting layer is silicon nitride, and the material of the sacrificial layer is silicon oxide.

19. The manufacturing method according to claim 18, wherein depositing the lower electrode layer, the dielectric layer and the upper electrode layer within the capacitive holes to form the capacitive structure further comprises:

forming a dielectric layer, the dielectric layer covering the lower electrode layer and an exposed semiconductor base;

forming an upper electrode layer covering the dielectric layer; and forming an electric conductor in the capacitive hole.

20. A capacitor, comprising:

a semiconductor base;

capacitive holes, which are arranged in the semiconductor base, and arranged in an array mode;

wherein each of the capacitive holes is formed by four round first openings and one second opening, a projection of each of the first openings on the semiconductor base is a first round projection, a projection of the second opening on the semiconductor base is a second projection, a contour line of the second projection respectively intersects with contours lines of four adjacent first round projections, and a continuous outer contour of the first round projection and the second projection forms a projection contour of a capacitive hole in the semiconductor base; and a lower electrode layer, a dielectric layer and an upper electrode layer, which are deposited in the capacitive holes in sequence.

* * * * *